United States Patent [19]

Kato et al.

[11] Patent Number: 5,432,337
[45] Date of Patent: Jul. 11, 1995

[54] FAIL-SAFE SCANNING CIRCUIT AND MULTI-AXIS LIGHT BEAM-TYPE SENSOR

[75] Inventors: Masakazu Kato; Koichi Futsuhara, both of Urawa, Japan

[73] Assignee: The Nippon Signal Co., Ltd., Japan

[21] Appl. No.: 175,398

[22] PCT Filed: May 15, 1992

[86] PCT No.: PCT/JP92/00631

§ 371 Date: Jan. 14, 1994

§ 102(e) Date: Jan. 14, 1994

[87] PCT Pub. No.: WO93/23772

PCT Pub. Date: Nov. 25, 1993

[51] Int. Cl.6 .............................................. G01V 9/04
[52] U.S. Cl. .................................. 250/221; 250/222.1
[58] Field of Search ........................... 250/221, 222.1; 340/555, 556, 557; 341/31

[56] References Cited

U.S. PATENT DOCUMENTS

| 3,805,061 | 4/1974 | De Missimy et al. | 250/209 |
| 4,266,124 | 8/1979 | Weber et al. | 250/221 |
| 4,309,696 | 1/1982 | Nagai et al. | 340/515 |
| 4,520,262 | 5/1985 | Denton | 250/221 |
| 4,661,880 | 4/1987 | Futsuhara . | |
| 4,757,417 | 7/1988 | Futsuhara . | |
| 5,015,840 | 5/1991 | Blau | 250/221 |
| 5,218,196 | 6/1993 | Dogul et al. | 250/221 |

FOREIGN PATENT DOCUMENTS

| 56-98667 | 8/1981 | Japan . |
| 57-142578 | 9/1982 | Japan . |
| 62-170873 | 7/1987 | Japan . |

Primary Examiner—David C. Nelms
Assistant Examiner—Steven L. Nichols
Attorney, Agent, or Firm—Finnegan, Henderson, Farabow, Garrett & Dunner

[57] ABSTRACT

The present invention provides a fail safe scanning circuit incorporating a fault detection circuit (30) for detecting if the scanning output condition of a scanning output generating circuit (20) for continuously generating a scanning output signal for application to a driven object, is normal or abnormal. It has a fail-safe construction such that the output from the fault detection circuit (30) is stopped when an abnormality is detected in the scanning output, and also when the fault detection circuit is faulty.

The invention also provides a multi-axis light beam-type sensor as a fail-safe human sensor for a system wherein a machine and a human work in the same space, by having a construction using two such fail-safe scanning circuits (41, 42), with pairs of light emitting elements and light receiving elements scan driven synchronously.

9 Claims, 10 Drawing Sheets

FAIL-SAFE SCANNING CIRCUIT AND MULTI-AXIS LIGHT BEAM-TYPE SENSOR

TECHNICAL FIELD

The present invention relates to a fail-safe scanning circuit which can detect an abnormal condition in a drive output for a plurality of driven objects, when the drive output is generated with successive switching to periodically scan drive the driven objects, and also relates to a fail-safe multi-axis light beam-type sensor using in such a fail-safe scanning circuit.

BACKGROUND ART

Multi-axis light beam-type sensors such as disclosed in U.S. Pat. No. 4,309,696, have been adopted as a method of ensuring the safety of an operator in situations such as where the operation of a press machine is carried out manually by the operator.

With such a multi-axis light beam-type sensor, there is a region where it is dangerous for an operator to be present when the press machine is operating, and a security region where it is safe to be present. At the boundary to such regions, a plurality of light emitting elements and light receiving elements are arranged facing each other so that light beams from the light emitting elements are emitted towards the light receiving elements. When a portion of an operator's body blocks at least one of the light beams so that an output from the light receiving element is not generated, it is judged that an operator has entered the danger region, and the press machine is stopped.

In this case, because the spacing of the light emitting elements and the light receiving elements aligned vertically is set narrow (of the order of 2 cm), and the light beams from the light emitting elements are spread to a certain degree, they are incident on not only the corresponding light receiving elements but also on other neighboring light receiving elements. In order to prevent generation of a light receiving element output due to the incidence of a light beam from a non corresponding light emitting element, the frequency of the light beams for each light emitting element is made different, and a filter which extracts only the light beam frequency of the corresponding light emitting elements is provided on the respective light receiving element side.

With the above-mentioned circuit construction however, an increase in the number of light emitting elements and light receiving elements results in an increase in the number of frequencies used, thus requiring an increase in the corresponding number of filters.

In order to solve this problem, a scanning drive system has been considered which scan drives the corresponding light emitting elements and light receiving elements with successive switching, so that the respective light emitting elements emit light in continuous succession at different times, with the process being repeated in cycles.

With the conventional scanning circuit however, which generates a scanning output for a driven object such as a light emitting element or a light receiving element, an abnormality such as the simultaneous generation of a plurality of scanning outputs causing the simultaneous generation of a plurality of light beams, cannot be detected.

It is an object of the present invention to address the above-mentioned problems, and provide a fail-safe scanning circuit which can detect an abnormal condition such as the simultaneous generation of a plurality of scanning outputs for driving driven objects, as well as providing a fail-safe multi-axis light beam-type sensor using such a fail-safe scanning circuit.

DISCLOSURE OF THE INVENTION

For this reason, the scanning circuit according to the present invention for driving a plurality of driven objects with continuous switching, and repeatedly scanning the objects in cycles, comprises;
- a counting circuit for periodically counting a number of input clock signals equal to the number of driven objects,
- a scanning output generating circuit for generating a number of scanning output signals equal to the number of driven objects, successively and at different times along a time axis, on the basis of the output signal from the counting circuit, and
- a fail-safe fault detection circuit for generating, an output of a logic value of "1" corresponding to the high energy condition when the output of the plurality of scanning outputs from the scanning output generating circuit is normal, and
- outputting a logic value of "0" corresponding to the low energy condition when at least one of abnormal conditions of, the output of the plurality of scanning output signals are overlapped on the time axis, and at least one scanning output signal is not generated in one scanning cycle.

As a result, in the case of the output condition of the scanning output signal becoming abnormal due for example to a fault in the scanning output generating circuit which outputs successively and periodically the scanning signal for the driven objects, the fault detection circuit detects this and the output from the fault detection circuit becomes a logic value of "0", indicating the scanning circuit abnormality.

The scanning output generating circuit may comprise;
- a first AND gate group made up of a number of AND gates equal to the number of driven objects, for outputting a succession of rectangular wave signals at different times on the time axis, based on the output signals from the counting circuit,
- a high frequency generating circuit for always outputting a high frequency signal, and
- a second AND gate group, made up of a number of AND gates equal to the number of driven objects, for taking the output rectangular wave signals from the respective AND gates of the first AND gate group, and the output from the high frequency generating circuit, and outputting high frequency signals from the high frequency generating circuit as scanning output signals, when the rectangular wave signals from the respective AND gates of the first AND gate group have a logic value of "1".

The fault detection circuit may comprise;
- a first detection part which detects if the plurality of scanning output signals from the scanning output generating circuit are overlapped on the time axis, and when overlapped, judges the abnormality and gives an output of logic value "0",
- a second detection part which detects if all of the plurality of scanning output signals from the scanning output generating circuit are generated within one scanning period, and if at least one scanning output signal is not generated, judges the abnormality and gives an output of logic value "0", a logical product operation circuit for carrying out a logical product operation on the output from the first detection part and the second detection part, and an on-delay circuit having a delay period at least greater than the time for one scanning period of the scanning output signal, for generating an output of a logical value of "1" indicating a normal scanning output signal condition, when a logical value of "1" is input from the logical product operation circuit.

The first detection part comprises;

a first adding circuit wherein the respective scanning output signals are voltage doubler rectified and added, and the change and discharge time coefficient for the voltage doubler rectifier is set to correspond to the generating period for one scanning output signal, a first window comparator which generates an output of logic value "1" when the output level of the first adding circuit is approximately equal to the voltage doubler rectified level of one scanning output signal, and a first rectifying circuit for rectifying the output from the first window comparator and outputting to the logical product operation circuit.

The second detection part comprises;

a second adding circuit wherein the respective scanning output signals are voltage doubler rectified and added, and the change and discharge time coefficient for the voltage doubler rectifier is set to correspond to one scanning period of all the scanning output signals, a second window comparator which generates an output of logic value "1" when the output level of the second adding circuit is approximately equal to the added value of all the voltage doubler rectified levels of the scanning output signals, and a second rectifying circuit for rectifying the output from the second window comparator and outputting to the logical product operation circuit.

The multi-axis light beam-type sensor according to the present invention comprises;

first and second fail-safe scanning circuits, driven by mutually common clock signals, each of which consists of the fail-safe scanning circuit as claimed in claim 1, a plurality of light emitting elements for generating light beams, the light emitting elements being scan driven with successive switching by a plurality of high frequency scanning output signals successively output from the first fail-safe scanning circuit, at different timing along a time axis, a plurality of light receiving elements disposed to confront the respective light emitting elements, which generate a light received output of logic value "1" on receipt of a light beam from a respective light emitting element, a plurality of amplifiers which amplify the light received output from the light receiving elements provided to each correspond to a respective light receiving element, and which take as a power source the rectangular wave signal from the second fail-safe scanning circuit, which is generated successively at different times along the time axis and which is synchronized with the scanning output signal from the first fail-safe scanning circuit, a first logical product operation circuit which carries out a logical product operation on the logical sum output of the respective amplified outputs from the plurality of amplifiers, and the output from the fault detection circuit in the second fail-safe scanning circuit, and an on-delay circuit which has a time delay which is at least greater than the time for one period of the scanning output signals, and which generates an output of logic value "1" on input of a logic value of "1".

With such a construction, if scanning output signals are normally generated from the scanning circuit, and the light beams from the light emitting elements are normally scanned, then the output from the on-delay circuit which has come via the first logical product operation circuit, is generated as a logic value of "1" (absence of an object), when the light beam from the light emitting element is received by the light receiving element, and as a logic value of "0" (presence of an object), when the light beam is not received by the light receiving element.

On the other hand, if the light received output does not generate successively and periodically when the scanning circuit is normal, due to a failure such as of a light emitting element, the output of the on-delay circuit becomes a logic value of "0", and remains in that condition. Also, with a fault on the scanning circuit side, the output of the first logical product operation circuit becomes a logic value of "0", and the output from the on-delay circuit is also set to a logic value of "0".

Accordingly, with a system operating in a work space common to both a machine and an operator, if drive of the machine is permitted with an on-delay circuit logic value output of "1", while drive of the machine is stopped with an on-delay circuit logic value output of "0", then a human sensor can be realized whereby the safety of a human can be reliably ensured.

Furthermore, if the frequency of the scanning output signals from the first fail-safe scanning circuit, which are applied to the respective light emitting elements, is made so that the frequency for the last scanned light emitting element in the scanning period is different to that for the other light emitting elements, then the synchronizing of the last light emitting element with the last light receiving element can be verified for each scanning cycle.

Moreover a construction is possible wherein, if the logical product output of the fault detection output of the scanning circuit, and the power supply input on the light emitting element side is made the power supply input to the light emitting elements, then drive of the light emitting elements is only possible when the scanning circuit is normal.

Moreover, a fail-safe circuit can be constructed to incorporate the following;

a third logical product operation circuit for carrying out a logical product operation on the output from the failure detection circuit in the first fail-safe scanning circuit, and the last scanning output signal in the scanning period, a fourth logical product operation circuit for carrying out a logical product operation on the logical sum of the amplified received light outputs from the plurality of amplifiers corresponding to the light receiving elements, and the last rectangular wave signal in the scanning period of the second fail safe scanning circuit, a fifth logical product operation circuit for carrying out a logical product operation on the output from the third logical product operation circuit, and the output from the fourth logical product operation circuit, and an off-delay circuit which has a time delay which is at least greater than the time for one period of the scanning output signals, and wherein an output of logic value "1" is stopped when an output of logic value of "1" from the fifth logical product operation circuit is stopped.

With such a fail-safe circuit, if the output from the off-delay circuit is input to the first logical product operation circuit, then the synchronizing of the last light emitting element with the last light receiving element can be verified for each scanning cycle without using different frequency signals.

BEST MODE FOR CARRYING OUT THE INVENTION

As follows is a detailed description of an embodiment of a fail-safe scanning circuit according to the present invention with reference to the drawings.

Figure 1:
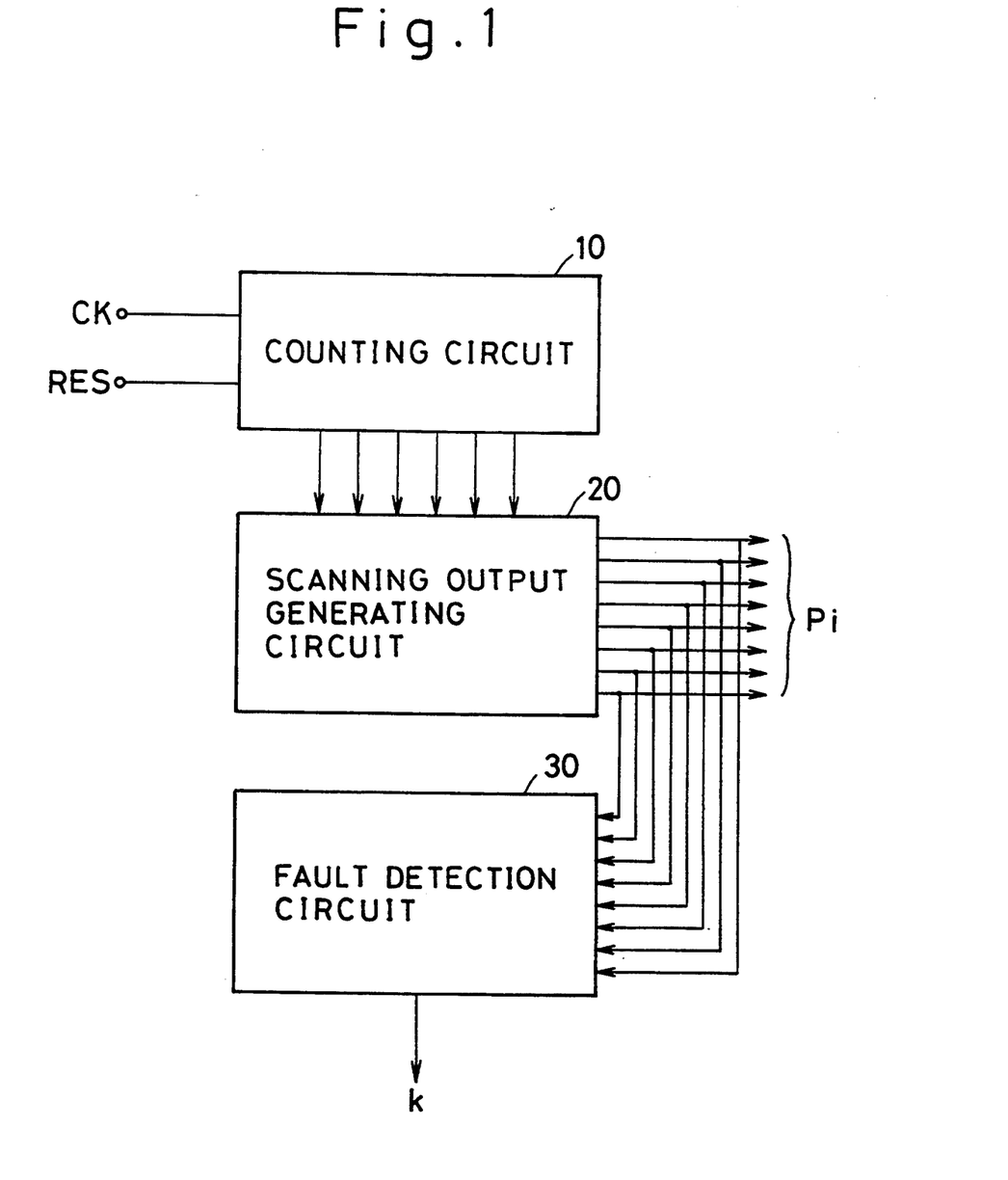
FIG. 1 is a overall block diagram of a first embodiment of a fail-safe scanning circuit, according to the present invention.

In FIG. 1, the fail-safe scanning circuit according to the present embodiment for driving a plurality of driven objects with continuous switching, and repeatedly scanning the objects in cycles, comprises;

a counting circuit 10 for periodically counting an exact number of the input clock signals CK equal to the number of scanning outputs generated for one driven object scanning period (as explained later there are eight driven objects in the present example), a scanning output generating circuit 20 for changing the count output signal of the counting circuit 10 into high frequency signals which are continuous along a time axis, and generating these high frequency signals as scanning output signals Pi (i=1 through 8) for driving the respective driven objects, and a fail-safe fault detection circuit 30 for generating, an output "k" of a logic value of 1 corresponding to the high energy condition, when a plurality of scanning output signals Pi from the scanning output generating circuit 20 are generated normally, and for indicating an abnormality by an output "k" of logic value "0" corresponding to the low energy condition, when at least one of an abnormal condition of, the output of the plurality of scanning output signals Pi being overlapped on the time axis, at least one scanning output signal not being generated in one scanning cycle, is detected, or when a fault occurs in the circuit itself.

Figure 2:
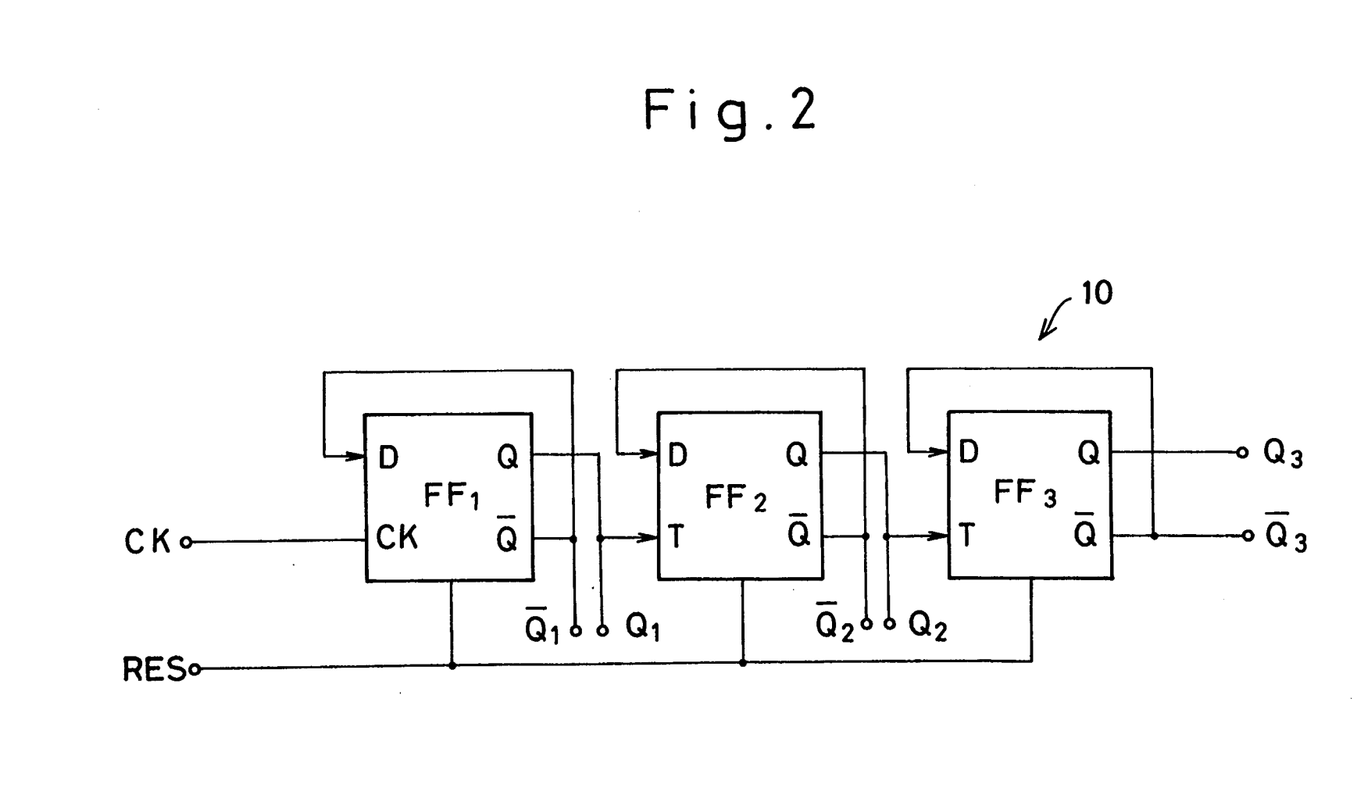
FIG. 2 is a block diagram showing an example of a counting circuit structure for the embodiment of FIG. 1.
Figure 3:
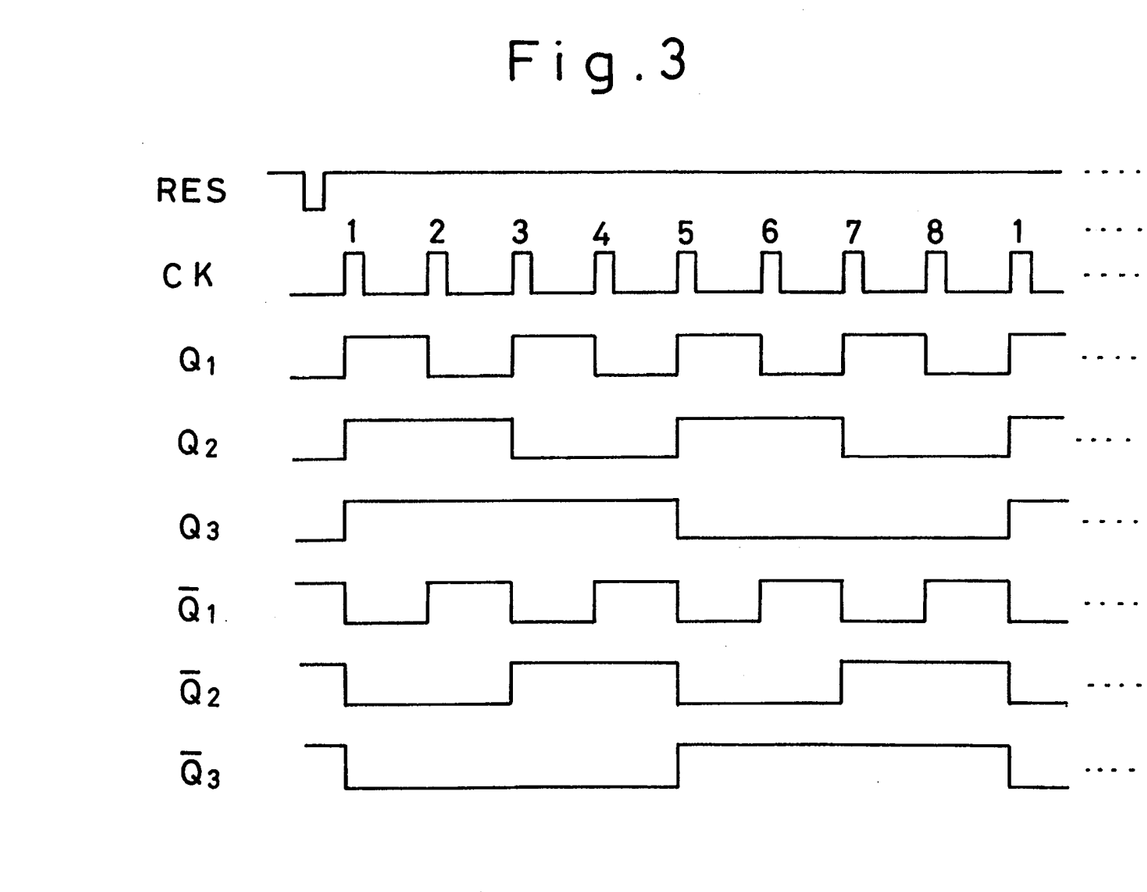
FIG. 3 is a time chart for the counting circuit output.

FIG. 2 shows details of the before-mentioned counting circuit 10. In FIG. 2, the counting circuit 10 of the present embodiment comprises three flip flops $FF_1$, $FF_2$ and $FF_3$ making up a binary counter. The counting circuit 10 periodically counts the clock signals CK with eight clock signals CK for one period, and gives a count result expressed in binary numbers of "0","1" as combinations of the outputs from the positive terminals Q1, Q2, Q3 and the inversion terminals $\overline{Q1}$, $\overline{Q2}$, $\overline{Q3}$ of the flip flops FF1, FF2, FF3. The timing for operation of the flip flops FF1, FF2, FF3 is shown in FIG. 3.

Figure 4:
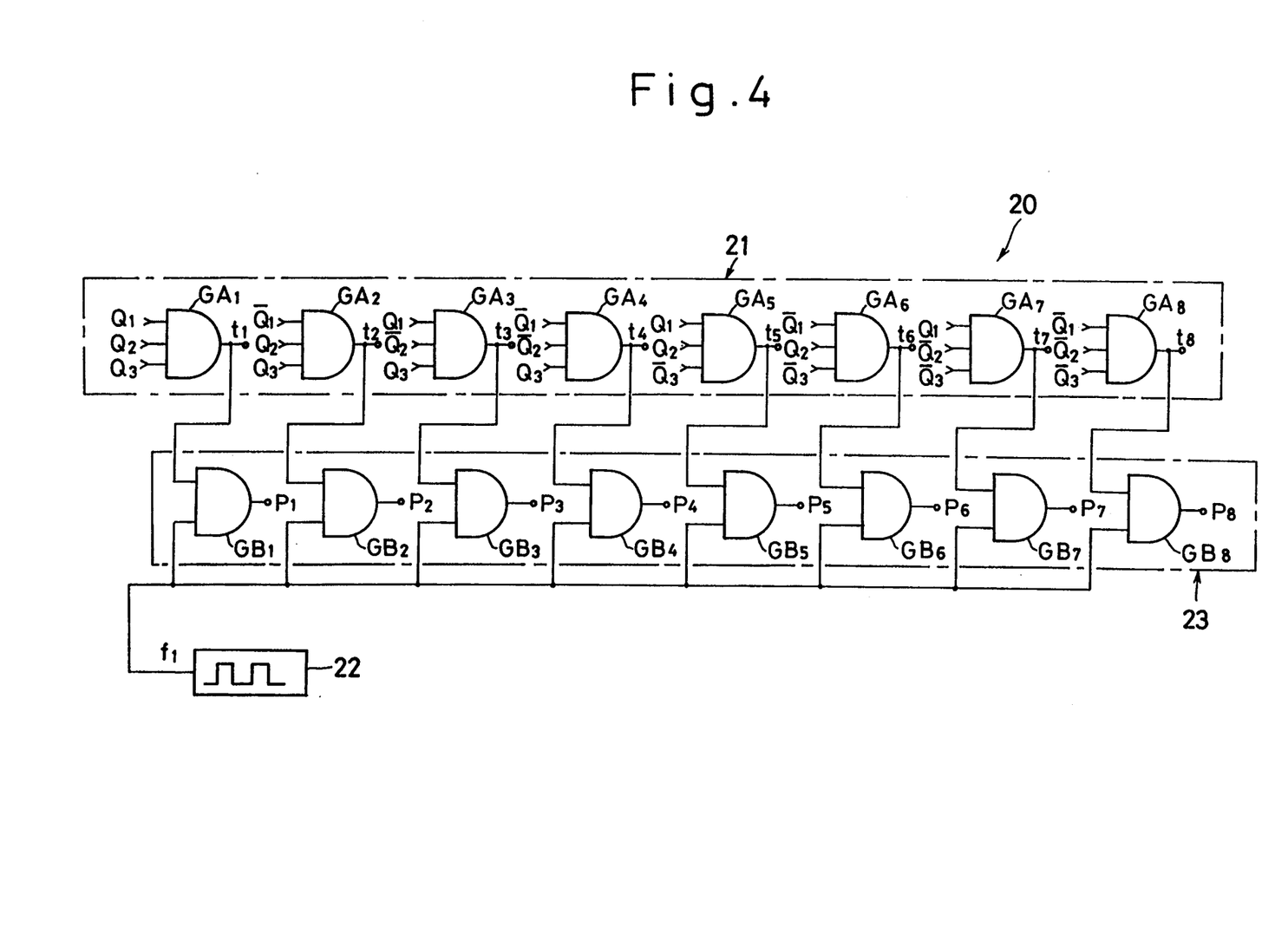
FIG. 4 is a block diagram of a scanning output generating circuit for the embodiment of FIG. 1.

FIG. 4 illustrates a construction of the scanning output generating circuit 20.

In FIG. 4, the scanning output generating circuit 20 of the present embodiment comprises, a first AND gate group 21 made up of a plurality of 3-input AND gates $GA_i$ (i=1 through 8), for converting the count output signals from the counting circuit into continuous rectangular wave signals $t_i$ (i=1 through 8) on the time axis, a high frequency generating circuit 22 for always outputting a high frequency signal of a frequency $f_1$, and second AND gate group 23 made up of a plurality of 2-input AND gates $GB_i$ (i=1 through 8), for taking the output rectangular wave signals $t_i$ from the respective AND gates $GA_i$ of the first AND gate group 21, and the output from the high frequency generating circuit 22, and changing the rectangular wave signals $t_i$ from the respective AND gate $GA_i$ of the first AND gate group 21, each into a high frequency signal of frequency $f_1$, and generating scanning output signals $P_i$ (i=1 through 8) for scanning drive of the driven objects.

The operation of the scanning output generating circuit 20 is as follows.

Figure 5:
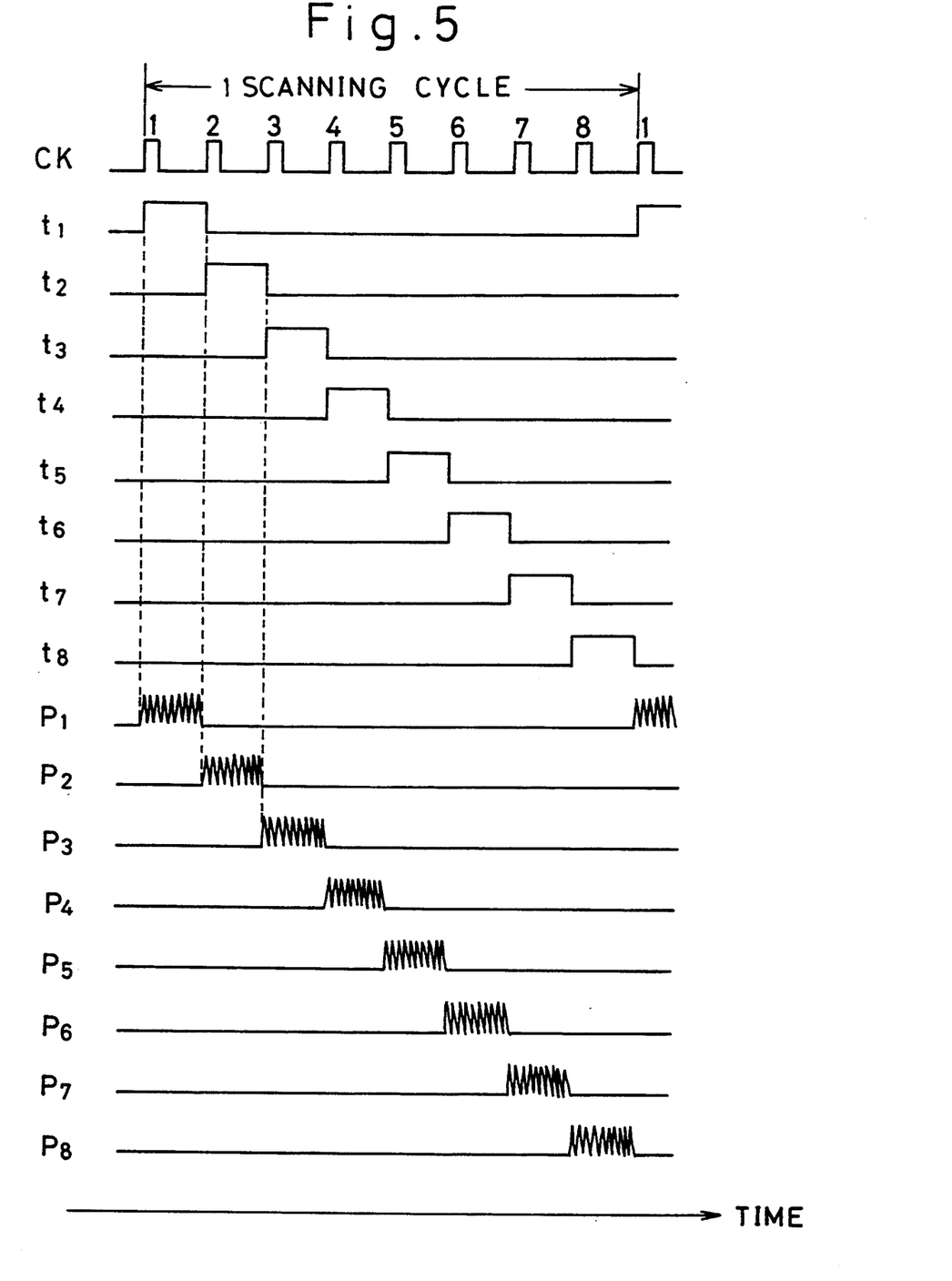
FIG. 5 is time chart for the rectangular wave signal and scanning output signal from the scanning output generating circuit.

The six outputs from the counting circuit 10 are made into combinations of three outputs to give eight signals, which are input respectively to the AND gates $GA_i$ of the first AND gate group 21. With regards to the respective AND gates $GA_i$, based on the respective operation drive timings of the counting circuit shown in FIG. 3, the initial clock signal CK input to the counting circuit 10, initially gives a high logic level (logical value of "1") output from the AND gate $GA_1$. Then due to the subsequent clock signals CK, the output from the AND gate $GA_1$ becomes a low logic level (logical value of "0"), while the output from the AND gate $GA_2$ becomes a logical value of "1". Thenceforth, the operation is executed for each of the clock signal CK inputs, with the outputs of AND gate $GA_3$ through AND gate $GA_8$, changing successively to a logical value of "1", giving an output for the first AND gate group 21 as a series of rectangular wave signals $t_1$ through $t_8$ along the time axis as shown in FIG. 5. After reset, the ninth clock signal CK then returns the AND gate $GA_1$ to the initial condition, to once more generate an output of logical value of "1". Accordingly, the eight clock signals CK generate a periodic succession of rectangular wave signals $t_i$ over one period.

Figure 6:
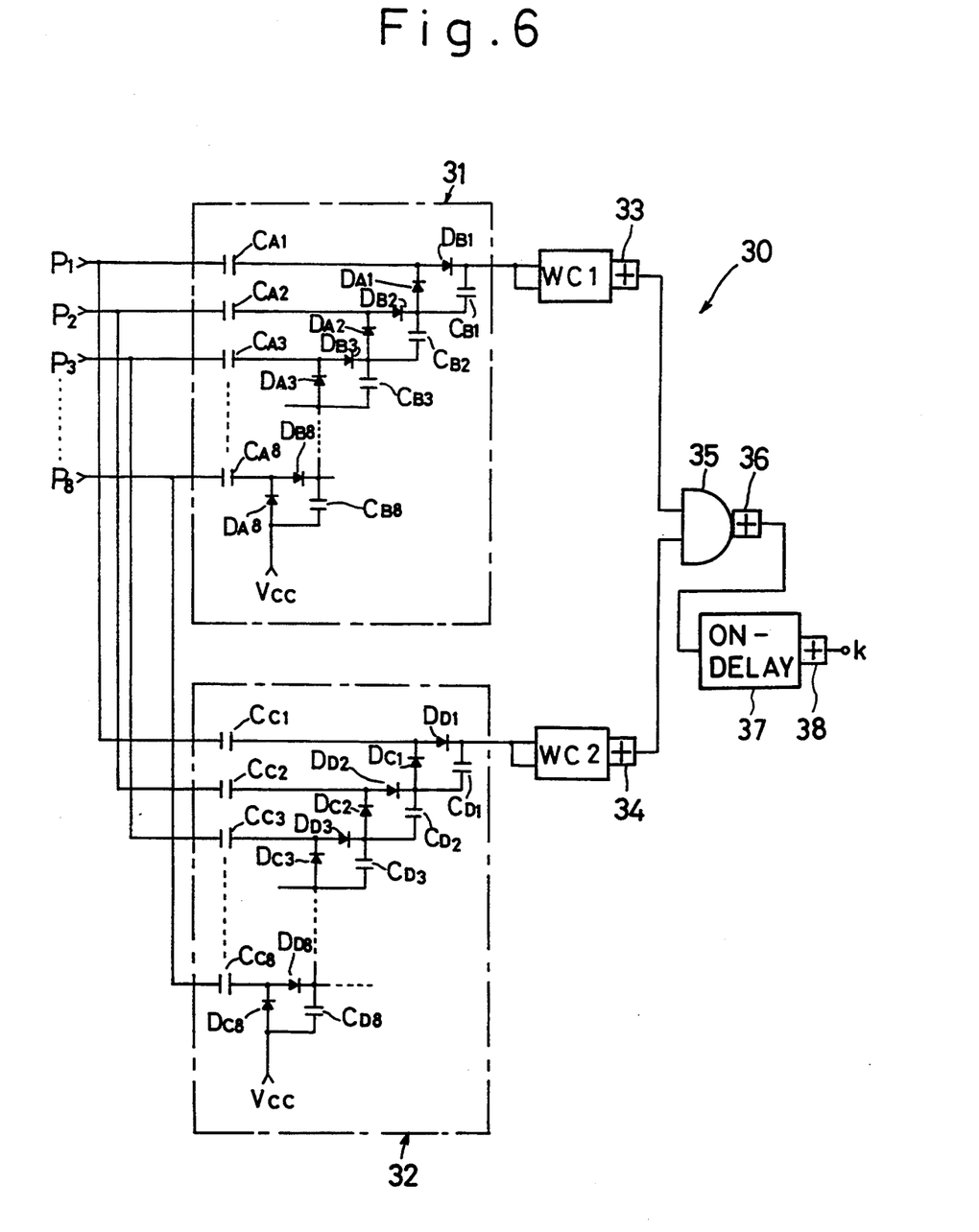
FIG. 6 is a block diagram of a fault detection circuit of the embodiment of FIG. 1.

The respective AND gates $GB_i$ of the second AND gate group 23, take the rectangular wave signal $t_i$, and when this has a logical value "1" condition, change it into a high-frequency signal of the frequency $f_1$ output from high-frequency generating circuit 22, and then output this. Accordingly, a succession of high-frequency scanning output signals $P_i$ along the time axis as shown in FIG. 5 are generated continuously and repeatedly from the second AND gate group 23. FIG. 6 shows the construction of the fault detection circuit 30.

The fault detection circuit 30 shown in FIG. 6 comprises the following components. A first adding circuit 31 consisting of a voltage doubler rectifying circuit which uses capacitors $C_{Ai}$, $C_{Bi}$, (i=1 through 8), and diodes $D_{Ai}$, $D_{Bi}$, (i=1 through 8). A second adding circuit 32 consisting of a similar voltage doubler rectifier circuit which uses capacitors $C_{Ci}$, $C_{Di}$ (i=1 through 8) and diodes $D_{Ci}$, $D_{Di}$ (i=1 through 8). Fail-safe first and second window comparators WC1, WC2 (see for example U.S. Pat. No. 4,661,880). First and second rectifying circuits 33, 34 which rectify the outputs from the first and second window comparators WC1, WC2. An AND gate 35 as a fail-safe logical product operation circuit (see for example U.S. Pat. No. 4,757,417), which takes the respective rectified outputs from the first and second rectifying circuits 33, 34. A fail-safe on-delay circuit 37 which takes the rectified output via the rectifying circuit 36 of the AND gate 35 and judges whether or not a fault exists and generates an output signal "k". A rectifying circuit 38 which rectifies the output from the on-delay circuit 37. The on-delay circuit 37 has a fail-safe function of giving a predetermined time delay output after the input of a signal, and of either extending this delay period or of not giving an output in the case of a malfunction.

With the first and second adding circuits 31, 32, the input scanning output signals Pi, pass through series inserted capacitors CAi, Cci and are clamped by the diodes $D_{Ai}$, $D_{Ci}$ at the power source voltage Vcc, and the input level stored in the respective capacitors $C_{Bi}$, $C_{Di}$.

Accordingly, if the scanning output signal $P_i$ is input independently as a single input, the input level of the scanning output signal $P_i$ is overlapped with power source voltage Vcc and input to the window comparators WC1, WC2. Moreover, when the scanning output signals $P_i$ are input simultaneously as several inputs, (for example when $P_i$ and Pj (j=i+1)is input), the scanning output signals $P_i$ are overlapped with the power source voltage Vcc, and stored in the respective capacitors $C_{Bi}$, $C_{Di}$. Moreover, the scanning output signals Pj are overlapped with the output levels of the scanning output signals Pi stored in the various capacitors CBi, CDi, and stored in the capacitors $C_{Bj}$, $C_{Dj}$ (j=i+1). This overlapped signal (ADD signal) is input to the window comparators WC1, WC2.

Here the discharge time constant set by the capacitors CAi, CBi in the first adding circuit 31 is set for the frequency f1 of the scanning output signal Pi. That is to say, the electrostatic capacity of the capacitor CAi, CBi is determined so that a period signal of 1/f1 the generating period for a single scanning output signal Pi can be sample held. Consequently, with the first adding circuit 31, when a signal scanning output signal $P_i$ is input, there is an immediate output rise from the capacitor CBi which is for storing the input, while when the input of a single scanning output signal $P_i$ is lost, the output immediately disappears. As a result, when the scanning output signal $P_i$ is generated normally in a continuous series along the time axis, the input level of the window comparator WC1 becomes the sum of the power source voltage Vcc, and the input level of one successively input scanning output signal $P_i$.

On the other hand, the time constant determined by the capacitor $C_{Ci}$, $C_{Di}$ in the second adding circuit 32, is determined for one round of scanning output signals $P_i$. In other words, to correspond to one period of the scanning output signals $P_i$. That is to say, the electrostatic capacity of the capacitor CCi, CDi is determined so that the sum of the input levels of the scanning output signals $P_i$ through $P_8$ can be sample held. Accordingly, in the second adding circuit 32, the input level of the scanning output signal Pi are stored in the capacitor CDi for storing these inputs (for sample holding) during the time for one round of successive inputs of the scanning output signal Pi. As a result, the input level to the window comparator WC2 becomes the sum of the power source voltage Vcc, and the added values of all of the input levels of the scanning output signals Pi over the time for one round of scanning output signal Pi. That is to say, if the input level of the output scanning signal $P_i$ is taken as $e_i$, then $Vcc+e_i$ is input to the window comparator WC1, and $Vcc+8\times ei$ is input to the window comparator WC2.

Moreover, the fail-safe AND gate 35 has a characteristic of generating an alternating current output signal only when input signals of predetermined levels (with the present embodiment, levels higher than the power source voltage Vcc) are input to the two input terminals. Furthermore, the window comparators WC1, WC2 are constructed with the two input terminals to the AND gate common, then in this case, the AND gate has the characteristic of generating an alternating current output signal only when the input levels for the common input terminals are at a predetermined range. With the present embodiment, the predetermined range for the window comparator WC1 is made $Vcc+ei\pm\Delta e$ (ei>$\Delta e$), while the predetermined range for the window comparator WC2 is made $Vcc+8$ ei+$\Delta e$.

Accordingly, only when the scanning output signal Pi is generated successively on the time axis with only one signal at a time, does the input level of the first adding circuit 31 fall within the predetermined range, and the window comparator WC1 generate successive outputs of logic value "1". When a plurality of scanning output signals Pi are generated simultaneously, the input level from the first adding circuit 31 becomes greater than $V_{cc}+2ei$, going outside the predetermined range, so that the output from the window comparator WC1 is cancelled and the logic value becomes "0". A first detection portion which detects whether or not the plurality of scanning output signals Pi are overlapped on the time axis comprises the first adding circuit 31, the window comparator WC1, and the first rectifying circuit 33.

With the window comparator WC2, only when all of the scanning output signals Pi are generated within a scanning period of the scanning output signal Pi, and the input level from the second adding circuit 32 falls within the predetermined range, does it generate successive outputs of logic value "1". When at least one scanning output signal Pi is not generated within a scanning period, the input level from the second adding circuit 32 becomes less than $V_{cc}+7ei$, going outside the predetermined range, so that the output from the window comparator WC2 is cancelled and the logic value becomes "0". A second detection portion which detects whether or not all of the scanning output signals Pi are generated within the one scanning period, comprises the second adding circuit 32, the window comparator WC2, and the second rectifying circuit 34.

With the AND gate 35, when both of the window comparators WC1, WC2 have an output condition of logic value "1", the output of logic value "1" is output to the on-delay circuit 37 via the rectifying circuit 36.

The on-delay circuit 37 is designed to have a time delay which is at least greater than the time for one period of the scanning output signals Pi.

As follows is a description of the operation of the fail-safe scanning circuit which comprises the abovementioned various circuits.

First is a description for the normal scanning circuit situation.

The counting circuit 10 is set to the initial condition by means of a reset signal RES. Subsequently, for each input of the clock signal CK, rectangular wave signals t1, t2, through t8 are output successively at different times along the time axis as shown in FIG. 5, from the respective AND gates GA1, GA2 through GA8 of the first AND gate group 21 of the scanning output generating circuit 20. At the same time, synchronized high frequency scanning output signals P1, P2 through P8 as shown in FIG. 5, having a frequency of f1, are generated successively from the respective AND gates GB1, GB2, through GB8 of the second AND gate group 23. This operation is carried out continuously in cycles of eight clock signals.

The before-mentioned scanning output signals Pi are input to the first and second adding circuits 31 and 32 of the fault detection circuit 30. If the scanning output signals Pi are normally generated successively at different times, then at the point in time when the scanning output signal P1 is generated, the output level of the first adding circuit 31 falls within the range of $V_{cc}+ei\pm\Delta e$, so that the first window comparator WC1 generates an output of logic value "1", and the rectified output of the rectifying circuit 33 is input to the AND gate 35. Moreover, with the second adding circuit 32, at the point in time of one round of scanning output signals Pi, the output level falls within the range of $V_{CC}+8ei\pm\Delta e$, so that the second window comparator WC2 generates an output of logic value "1", and the rectified output of the rectifying circuit 34 is input to the AND gate 35. As a result, the AND gate 35 generates an output of logic value "1", and the rectified output of the rectifying circuit 37 is input to the on-delay circuit 38. In the on-delay circuit 37, after input of the rectified output from the rectifying circuit 36, the output is delayed until the scanning output signal Pi has made one round. On completion of one round, an output from the on-delay circuit 37 is generated to produce a rectified output "k" from the rectifying circuit 38. The rectified output "k" becomes a logic value "1" output corresponding to a high energy condition, only when the scanning circuit is normal. Next is a description for a faulty scanning circuit situation.

The following modes are considered as fault patterns for the counting circuit 10 and the first and second AND gates 21, 22. Modes wherein the output signals from the flip flops FF1, FF2, FF3 and the respective AND gates GAi, GBi are fixed at logic values of "1" or "0". Modes wherein a logical operating function is lost with the occurrence of a fault in the respective AND gates GAi, GBi, so that with the input of only one gate input signal, that input signal directly becomes the scanning output signal Pi and is output.

A failure mode is considered wherein, when such a fault occurs in one or a plurality of the respective AND gates GAi, GBi etc., a plurality of scanning output signals Pi, Pj (i$\neq$j) occurs at the same time, and the plurality of scanning output signals Pi, Pj (i$\neq$j) are overlapped at one part. Moreover, another failure mode is considered wherein the failure mode mentioned before overlaps with a failure of one of the scanning output signals Pi not occurring. In addition to this, there is the failure mode wherein a high frequency signal of the high frequency generating circuit 22 is continuously generated as a scanning output signal Pi, in the case of a fault where the output signal of the counting circuit 10 is fixed at 1, or the input level on the rectangular wave signal ti side of the AND gate GBi is fixed at a logic value of "1".

The fault detection circuit 31 operates in relation to these fault modes in the following manner.

In the case where a logic value "1" failure occurs in the counting circuit 10 or in at least one of the AND gates GAi, and the high frequency signal of the frequency f1 of the high frequency generating circuit 22 is continuously output as a scanning output signal Pi, if any of the other scanning output signals Pi is output, the input level to the window comparator WC1 from the first adding circuit 31 becomes greater than $V_{cc}+2ei$ so that the output from the window comparator WC1 is stopped.

Moreover, in the case where a fixed logic value "0" fault occurs in one or a plurality of the AND gates GBi of the scanning output generating circuit 20, and one or a plurality of the scanning output signals Pi is not output, the input level to the window comparator WC2 from the second adding circuit 32 becomes less than $V_{cc}+7ei$ so that the output from the window comparator WC2 is stopped.

Furthermore, in the case of a plurality of scanning output signals Pi being output overlapping each other due to a fault of the AND gates GAi, GBi, there is time for the input level to the window comparator WC1 from the first adding circuit 31 to become greater than $V_{cc}+2ei$, so that there is time for the output from the window comparator WC1 to be stopped.

Additionally, in the case of a part of the plurality of scanning output signals Pi being output overlapping each other due to a fault of the AND gates GAi, GBi, similarly, there is time for the input level to the window comparator WC1 from the first adding circuit 31 to become greater than $V_{cc}+2ei$, so that there is time for the output from the window comparator WC1 to be stopped.

Consequently, in the case of the occurrence of a failure in the counting circuit 10 or the scanning output generating circuit 20, there is time for the output of the AND gate 35 to be stopped during at least one scanning period. Furthermore, this condition is repeated for each one scanning period. Also, since the delay time for the on-delay circuit 37 is set to be longer than the time for one scanning period, if once the output of the AND gate 35 is stopped, the output from the on-delay circuit 37 remains in the stop condition, and the output "k" takes on an output of logic value "0" corresponding to the low energy condition, enabling detection of the fault.

That is to say, with the fault detection circuit 30, when one or a plurality of $P_i$s related to scanning output signals $P_i$ (i=1 through 8) is not input, or when two or more are generated simultaneously, or part of two or more signals are overlapped, then in either case, the output signal "k" becomes a logic value "0".

A binary counter using flip flops is constructed as in FIG. 2, and as shown in FIG. 4, this produces the periodically generated successive signals ti (i=1 through 8) using the 3-input AND gate. However since the periodically generated successive signals ti (i=1 through 8) may be formed in a similar manner if a Johnson Counter is constructed using a shift resistor and 2-input AND gate, the scanning output signals Pi (i=1 through 8) can be generated in a similar manner to FIG. 4 using these output signals ti (i=1 through 8). Moreover, the fault detection circuit 30 can operate in a similar manner to the scanning output signals Pi (i=1 through 8) for this case where the Johnson Counter is constructed.

With regards to the voltage doubler rectifying circuit comprising the capacitors CA8, CB8 and diodes DA8, DB8 of the first adding circuit 31, if a short circuit failure occurs in the capacitors CA8, the source voltage $V_{cc}$ and the input side of the scanning output signal Pi become a short circuit condition through the diode DA8, so that the output from the capacitor CA8 becomes zero. Furthermore, with the occurrence of a disconnection failure in the diode DA8, or if a short circuit failure occurs in the diode DB8, the output becomes zero. In the case of a disconnection failure in the diode DA8 with no failure in the capacitor CA8, then the discharge path of the capacitor CA8 is broken so that no output occurs. In the case of a short circuit failure occurring only in the diode DB8, an alternating current signal occurs between the terminals of the capacitor CB8 and a direct current signal is not generated. Of course, with the occurrence of a disconnection failure in the capacitor CA8, a short circuit failure occurring in the diode DA8, and a disconnection failure occurring in the diode DB8, no output occurs since the alternating current signal is not transmitted to the output side. That is to say, even if a disconnection or short circuit failure occurs in the capacitor CA8 or the diodes DA8, DB8, a direct current output is not produced.

In the case of a short circuit failure occurring in the capacitor CB8, an output is not produced. However with a disconnection failure, the output becomes an alternating current signal. In this case, if the capacitor CB8 is a four terminal capacitor, the alternating current signal is not produced. However, for the case when a four terminal capacitor is not adopted, the voltage doubler rectifying circuit is a circuit which, when there is no alternating current input signal, it does not give an output of a higher level than the power source voltage Vcc, even with a fault.

Accordingly, with the first and second adding circuits 31, 32 comprising such a voltage doubler rectifying circuit, when there is no scanning output signal Pi (input signal) for each of the rectifying circuits, these adding circuits do not give an output, even with a fault. The same also applies for the rectifying circuits 33, 34, 36 provided on the output sides of both window comparators WC1, WC2 and the AND gate 35. Moreover, both window comparators WC1, WC2, the AND gate 35 and the on-delay circuit 37 also have the characteristic of not producing an output with a fault.

Due to this, with the fault detection circuit 30 shown in FIG. 6, when the scanning output signal Pi is not input, an output "k" is not wrongly produced with a fault, resulting in a fail safe circuit.

Since a fault condition of the first and second counting circuits 10, and the scanning output generating circuit 20 is detected by the fault detection circuit 30 having such fail safe characteristics, then in the case of a fault in either of the counting circuit 10 or the scanning output generating circuit 20, and a fault in the fault detection circuit 30 itself, the output "k" of the fault detection circuit 30 is stopped, enabling fault detection. Consequently, the scanning circuit of the present embodiment constructed with these circuits, has a fail safe construction.

Next is a description of an embodiment of a multi-axis light beam-type sensor according to the present invention using the above mentioned fail safe scanning circuits.

Figure 7:
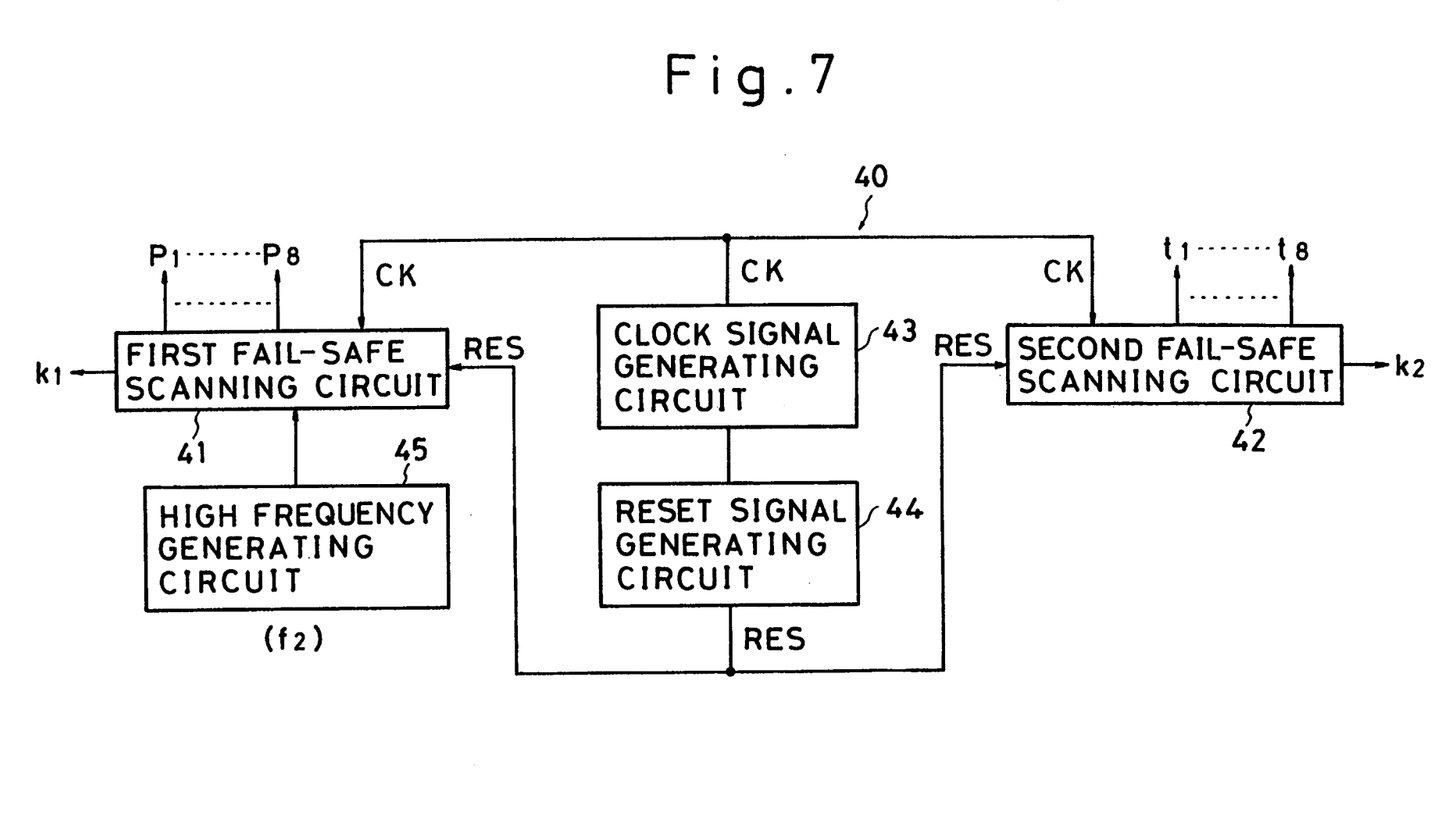
FIG. 7 is a block diagram of a scanning output generating circuit for a first embodiment of a multi-axis light beam-type sensor, according to the present invention.
Figure 8:
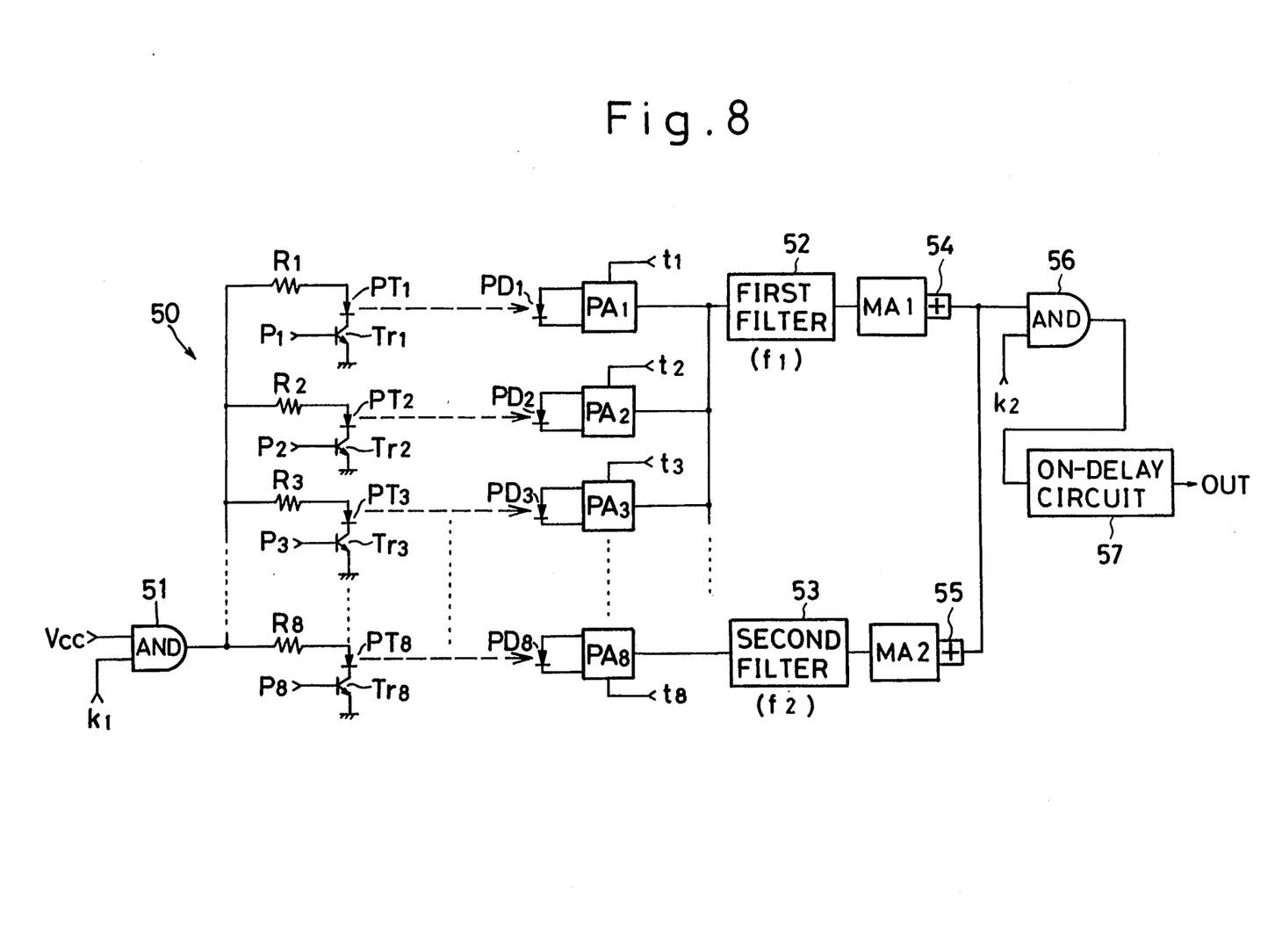
FIG. 8 is a block diagram of the sensor circuit of the first embodiment of FIG. 7.

A first embodiment of the multi-axis light beam-type sensor is shown in FIGS. 7 and 8.

The sensor of the present embodiment comprises a scanning output generating circuit as shown in FIG. 7, incorporating a fail-safe scanning circuit, and a sensor circuit as shown in FIG. 8 for detecting the passing of an object.

The scanning output generating circuit 40 of FIG. 7 comprises first and second fail safe scanning circuits 41, 42 similar to those described in FIG. 1 through FIG. 6, a clock signal generating circuit 43 for supplying a clock signal CK to the scanning circuits 41, 42, a reset signal generating circuit 44 for supplying a reset signal RES to the same scanning circuits 41, 42, and a high frequency generating circuit 45 for supplying a high frequency signal of a frequency f2 to the first fail safe scanning circuit 41.

The scanning output signal Pi (i=1 through 8) of the first fail safe scanning circuit 41 is input to the bases of the plurality of transistors Tri (i=1 through 8) of the sensor circuit shown in FIG. 8. A high frequency signal of frequency f1, however is only given to the transistors Tr1 through Tr7, while a high frequency signal of frequency f2 is given to the final transistor Tr8 by connecting the output of the high frequency generating circuit 45, in place of the output of the high frequency generating circuit 22, to the input of the AND gate GB8 in the final stage of the second AND gate group 23 of FIG. 4.

The rectangular wave signal ti (i=1 through 8) of the second fail safe scanning circuit 42 is applied as a power supply to the pre-amps PAi (i=8) connected respectively to the plurality of light receiving elements PDi (i=1 through 8) of the sensor circuit shown in FIG. 8.

Moreover, the outputs k1, k2 of the fail safe scanning circuits 41, 42 correspond to the output "k" for fault detection in FIG. 6.

The sensor circuit 50 of FIG. 8 comprises light emitting elements PT1 through PT8, light receiving elements PD1 through PD8, a first filter circuit 52, a second filter circuit 53, main amps MA1, MA2, rectifying circuits 54, 55, an AND gate 56 and an on-delay circuit 57. The light emitting elements PT1 through PT8 act as driven objects which are scan driven by the scanning output signals Pi from the before-mentioned first fail-safe scanning circuit 41 via transistors TR1 through TR8. The light receiving elements PD1 through PD8 are located opposite the light emitting elements PT1 through PT8, and are connected respectively to the pre-amps PA1 through PA8 driven by application of rectangular wave signals T1 through T8 from the second fail-safe scanning circuit 42, and further sequentially scanned by the pre-amps PA1 through PA8. They act as driven objects which give an output on receipt of light beams from the light emitting elements PTi. The AND gate 51 acts as a fail-safe second logical product operation circuit wherein the output is lost at the time of a failure in a similar manner to that mentioned before, for carrying out the logical product operation on the output k1 from the first fail safe scanning circuit 41 and the power source Vcc. The first filter circuit 52 extracts a signal of frequency f1 from the wired OR connected outputs of the output signals from the pre-amps PA1 through PA7. The second filter circuit 53 extracts a signal of frequency f2 from the output signal from the final pre-amp PA8. The main amps MA1, MA2 amplify the respective outputs from the first filter circuit 52 and second filter circuit 53. The rectifying circuits 54, 55 rectify the outputs from the respective main amps MA1, MA2. The AND gate 56 acts as a fail safe first logical product operation circuit which carries out, in a similar manner to that mentioned before, a logical product operation on the wired OR output from the rectifying circuits 54, 55, and the output k2 from the second fail-safe scanning circuit 42. The on-delay circuit 57 has a construction similar to the on-delay circuit 37 included in the before-mentioned scanning circuit 30, which delays the output for a fixed time to the input from the AND gate 56. R1 through R8 are resistors.

Next is a description of the operation of the multi-axis light beam-type sensor according to the present embodiments.

The first and second fail safe scanning circuits 41, 42, as mentioned before, generate periodic synchronous scanning output signals Pi, and rectangular wave signals ti, based on the clock signal CK from the clock signal generating circuit 43, and the reset signal RES from the reset signal generating circuit 44. If the respective scanning circuits 41, 42 are normal, the outputs k1, k2 are input to the respective AND gate 51 and AND gate 56. Consequently, only when the first fail-safe scanning circuit 41 is normal, is a power source voltage Vcc supplied to the light emitting elements PTi. With supply of the voltage Vcc, the light emitting elements PT1 through PT8 are synchronized with the output of scanning output signals P1 through P7 of frequency f1, and P8 of frequency f2 from the first fail-safe scanning circuit 41, and scanned in a continuous succession along the time axis and emitting light.

On the other hand, the power supply is input to the pre-amps PA1 through PA8 on the side of the light receiving elements PD in continuous succession along the time axis, on the basis of the rectangular wave signal t1 through t8 from the second fail safe scanning circuit 42.

If the scanning output signals Pi from the first and second fail-safe scanning circuits 41, 42, and the rectangular wave signals ti are normally synchronized, the light beam from the light emitting elements PT1 through PT7 is received by the corresponding light receiving elements PD1 through PD7. It then passes via the corresponding pre-amp PAi, to the first filter 52 where the signal of frequency f1 is filtered. The signal is then amplified by the main amp MA1, and rectified by the rectifying circuit 54. Moreover, the light beam from the light emitting element PT8 is received by the corresponding light receiving element PD8. It then passes via the corresponding pre-amp PA8, to the second filter 52 where the signal of frequency f2 is filtered. The signal is then amplified by the main amp MA2, and rectified by the rectifying circuit 55. Then the wired OR outputs of the rectifying circuits 54, 55, are input to the AND gate 56.

Accordingly, if these respective circuits operate normally, then for two inputs to the AND gate 56, a signal of a high level logic value "1" is input. The output thus becomes a logic value of "1" which is input to the on-delay circuit 57. If after a predetermined time delay the on-delay gives an output, then the sensor circuit 50 is normal.

If in this condition, an object is present between the light emitting elements PTi and the light receiving elements PDi, the light received output of the light receiving element PDi is not produced so that the output of the on-delay circuit 57 is stopped, warning of the presence of the object.

Moreover, even with a fault such as where part of the light received output is not generated periodically within the one period interval, since the delay period of the on-delay circuit 57 is set to be longer than one scanning period, then when the related fault is produced, the output of the on-delay circuit 57 is maintained in the STOP condition (logic value "0"). Furthermore, the circuit can be made so that when the output of the on-delay circuit 57 stops, then switch operation or the like has to be made again to drive the mechanical moving portion of a press etc..

Moreover, since the frequency of the light for the last light emitting element PT8 is made different to that of the other light emitting elements PT1 through PT7, then when the light emitting element PT8 and the light receiving element PD8 are not synchronized, an output from the main amp MA2 is not generated. It is thus possible to judge whether or not the last light emitting element PT8 is synchronized with the light receiving element PD8 in the one scanning period. Furthermore, with the light beam sensor of the present embodiment, when comprised of a plurality of units connected together as a single unit, the generation of a light received output from the last light receiving element PD8, due to a light beam from a neighboring unit can be prevented.

Figure 9:
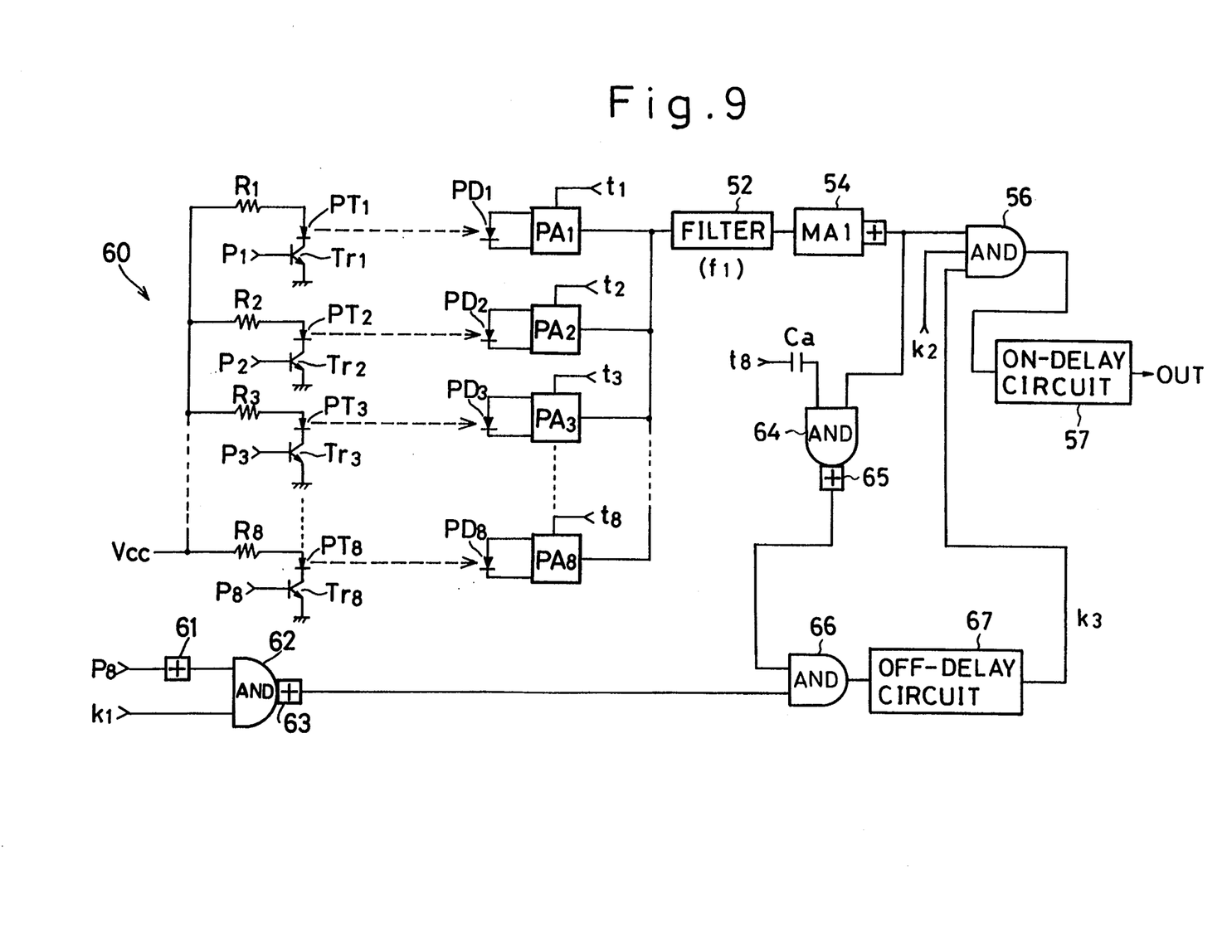
FIG. 9 is a block diagram of a sensor circuit for a second embodiment of a multi-axis light beam-type sensor.

A second embodiment of the multi-axis light beam-type sensor is shown in FIG. 9.

With this embodiment, the light emitting elements PT1 up to PT8 emit light at the same frequency f1.

The sensor circuit 60 of the second embodiment shown in FIG. 9, has a power source voltage Vcc supplied directly to the light emitting elements PTi. Also the output from the light receiving element PD8, is wired OR connected to the other light receiving elements PD1 through PD7, and input to the f1 filtering filter 57.

The sensor circuit 60 incorporates the following components. An AND gate 62 which acts as a third logical product operation circuit, for carrying out a logical product operation on the rectified output of the scanning output signal P8 from the first fail-safe scanning circuit 41 rectified in the rectifying circuit 61, and the output k1 of the first fail-safe scanning circuit 41. A rectifying circuit 63 which rectifies the output from the AND gate 62. A capacitor Ca for inputting the rectangular wave signal t8 of the second fail-safe scanning circuit 42 as alternating current. An AND gate 64 which acts as a fourth logical product operation circuit for carrying out a logical product operation on the output from the capacitor Ca, and the rectified output from the main amp MA1. A rectifying circuit 65 for rectifying the output of the AND gate 64. An AND gate 66 which acts as a fifth logical product operation circuit for carrying out a logical product operation on both rectified outputs from the respective rectifying circuits 63 and 65. An off-delay circuit 67. The output from the off-delay circuit 67 is input to the AND gate 56.

Here, as with the previously mentioned respective AND gates, the respective AND gates 62, 64, and 66 have a fail-safe construction such that at the time of a fault, an output is not produced.

Figure 10:
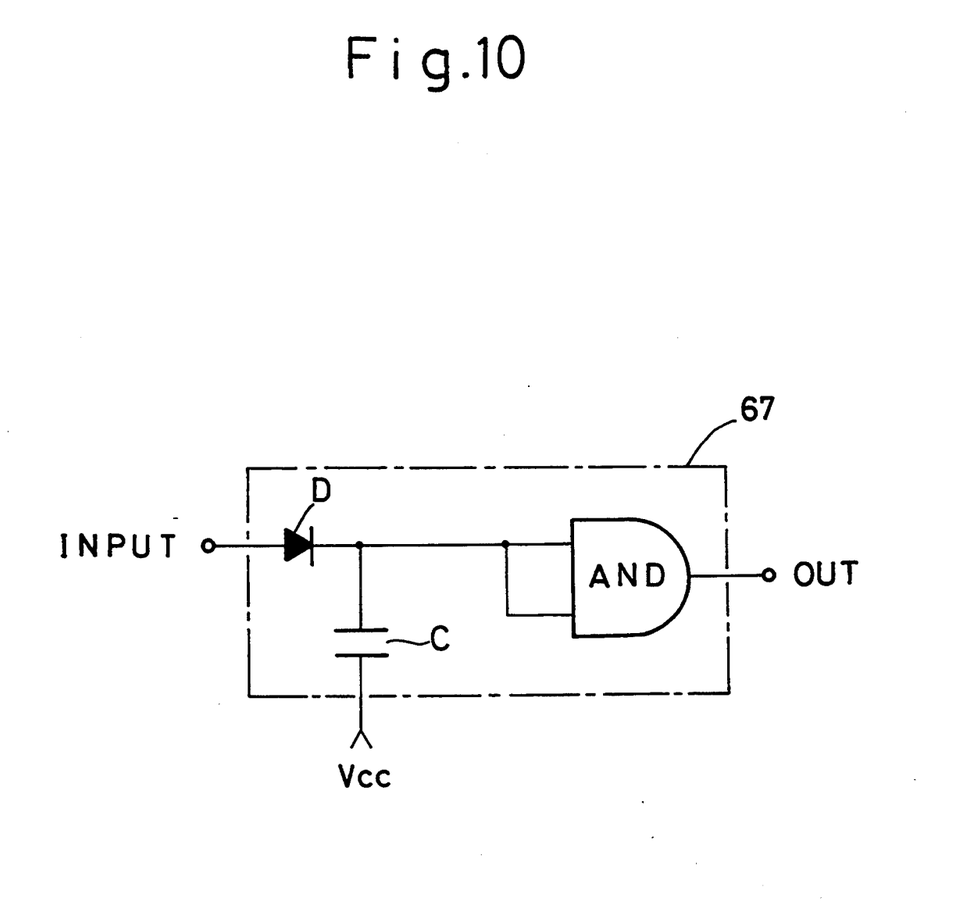
FIG. 10 is a schematic diagram showing an example of a structure of an off-delay circuit used in the sensor circuit of the second embodiment of FIG. 9.

Furthermore, the off-delay circuit 67 is constructed so that at normal times, the output from the AND gate 66 which is generated periodically, is maintained for at least one scanning period. Such an off-delay circuit 67 can be realised if a diode D and capacitor C are inserted on the input side of the fail-safe AND gate as shown in FIG. 10.

With the sensor circuit 60 of such construction, the output from the off-delay circuit 67 becomes a logical value of "1" only when the light emitting element PT8 and the light receiving element PD8 are synchronized. If all is normal, an output is generated from the AND gate 56, generating an output from the on-delay circuit 57 which indicates that the sensor circuit 60 is normal.

With such a sensor circuit 60, the second filter and main amp MA2 in FIG. 8 become redundant.

With the present invention as described above, when a plurality of driven objects are periodically scan driven, then at an abnormal time such as when a driven object is driven at the same time as another, the output is reliably stopped. A fail-safe scanning circuit which can warn of a malfunction is thus realized.

Furthermore with a multi-axis light beam-type sensor utilizing such a fail-safe scanning circuit, since the output is positively stopped at the time of a fault or an abnormality in the scanning drive, then a fail-safe sensor having high safety requirements such as a fail-safe human sensor can be realised.

Industrial Applicability

With the present invention used in a system operating in a work space common to both a machine and an operator, the safety of the operator working in the common work space can be considerably improved. Hence operator injury from the machine can be prevented, greatly improving industrial utility.

We claim:

1. A fail-safe scanning circuit for driving a plurality of driven objects with continuous switching, and repeatedly scanning the objects in cycles, comprising;
    a counting circuit for periodically counting a number of input clock signals equal to the number of driven objects,
    a scanning output generating circuit for generating a number of scanning output signals equal to the number of driven objects, successively and at different times along a time axis, on the basis of the output signal from the counting circuit, and
    a fail-safe fault detection circuit for generating, an output of a logic value of "1" corresponding to the high energy condition when the output of the plurality of scanning output signals from the scanning output generating circuit is normal, and
    outputting a logic value of "0" corresponding to the low energy condition when at least one of an abnormal condition of, the output of the plurality of scanning output signals are overlapped on the time axis, and at least one scanning output signal is not generated in one scanning cycle.

2. A fail-safe scanning circuit as claimed in claim 1, wherein said scanning output generating circuit comprises;
    a first AND gate group made up of a number of AND gates equal to the number of driven objects, for outputting a succession of rectangular wave signals at different times on the time axis, based on the output signals from the counting circuit,
    a high frequency generating circuit for always outputting a high frequency signal, and
    a second AND gate group, made up of a number of AND gates equal to the number of driven objects, for taking the output rectangular wave signals from the respective AND gates of the first AND gate group, and the output from the high frequency generating circuit, and outputting high frequency signals from the high frequency generating circuit as scanning output signals, when the rectangular wave signals from the respective AND gates of said first AND gate group have a logic value of "1".

3. A fail-safe scanning circuit as claimed in claim 1, wherein said fault detection circuit comprises;
    a first detection part which detects if the plurality of scanning output signals from the scanning output generating circuit are overlapped on the time axis, and when overlapped, judges the abnormality and gives an output of logic value "0",
    a second detection part which detects if all of the plurality of scanning output signals from the scanning output generating circuit are generated within one scanning period, and if at least one scanning output signal is not generated, judges the abnormality and gives an output of logic value "0",
    a logical product operation circuit for carrying out a logical product operation on the output from the first detection part and the second detection part, and
    an on-delay circuit having a delay period at least greater than the time for one scanning period of the scanning output signal, for generating an output of a logical value of "1" indicating a normal scanning output signal condition, when a logical value of "1" is input from the logical product operation circuit.

4. A fail-safe scanning circuit as claimed in claim 3, wherein said first detection part comprises;
    a first adding circuit wherein the respective scanning output signals are voltage doubler rectified and added, and the charge and discharge time coefficient for the voltage doubler rectifier is set to correspond to the generating period for one scanning output signal,
    first window comparator which generates an output of logic value "1" when the output level of the first adding circuit is approximately equal to the voltage doubler rectified level of one scanning output signal, and a first rectifying circuit for rectifying the output from said first window comparator and outputting to the logical product operation circuit.

5. A fail-safe scanning circuit as claimed in claim 3, wherein said second detection part comprises;
   a second adding circuit wherein the respective scanning output signals are voltage doubler rectified and added, and the charge and discharge time coefficient for the voltage doubler rectifier is set to correspond to one scanning period of all the scanning output signals,
   a second window comparator which generates an output of logic value "1" when the output level of the second adding circuit is approximately equal to the added value of all the voltage doubler rectified levels of the scanning output signals, and
   a second rectifying circuit for rectifying the output from said second window comparator and outputting to the logical product operation circuit.

6. A multi-axis light beam-type sensor comprising;
   first and second fail-safe scanning circuits driven by mutually common clock signals, each of which consists of the fail-safe scanning circuit as claimed in claim 1,
   a plurality of light emitting elements for generating light beams, the light emitting elements being scan driven with successive switching by a plurality of high frequency scanning output signals successively output from the first fail-safe scanning circuit, at different timing along a time axis,
   a plurality of light receiving elements disposed to confront the respective light emitting elements, which generate a light received output of logic value "1" on receipt of a light beam from a respective light emitting element,
   a plurality of amplifiers which amplify the light received output from the light receiving elements provided to each correspond to a respective light receiving element, and which take as a power source the rectangular wave signal from the second fail-safe scanning circuit, which is generated successively at different times along the time axis and which is synchronized with the scanning output signal from the first fail-safe scanning circuit,
   a first logical product operation circuit which carries out a logical product operation on the logical sum output of the respective amplified outputs from the plurality of amplifiers, and the output from a fault detection circuit in the second fail-safe scanning circuit, and
   an on-delay circuit which has a time delay which is at least greater than the time for one period of the scanning output signals, and which generates an output of logic value "1" on input of a logic value of "1".

7. A multi-axis light beam-type sensor as claimed in claim 6, constructed such that the frequency of the scanning output signals from the first fail-safe scanning circuit, which are applied to the respective light emitting elements, is made so that the frequency for the last scanned light emitting element in the scanning period is different to that for the other light emitting elements; and incorporating a first filter for taking a logical sum output of the amplified light received outputs from the light receiving elements corresponding to said other light emitting elements, and extracting a signal corresponding to the frequency applied to the said other light emitting elements, and a second filter for taking the amplified light received outputs of the light receiving element corresponding to said last scanned light emitting element, and extracting a signal corresponding to the frequency applied to the last scanned light emitting element, the logical sum output from the first and second filters being input to said first logical product operation circuit.

8. A multi-axis light beam-type sensor as claimed in claim 6, comprising a second logical product operation circuit which carries out a logical product operation on the output from the fault detection circuit in the first fail-safe scanning circuit, and the input power supply for said plurality of light emitting elements, the output from said second logical product operation circuit becoming the input power supply for the light emitting elements.

9. A multi-axis light beam-type sensor as claimed in claim 6, comprising;
   a third logical product operation circuit for carrying out a logical product operation on the output from the failure detection circuit in the first fail-safe scanning circuit, and the last scanning output signal in the scanning period,
   a fourth logical product operation circuit for carrying out a logical product operation on the logical sum of the amplified received light outputs from the plurality of amplifiers corresponding to the light receiving elements, and the last rectangular wave signal in the scanning period of the second fail safe scanning circuit,
   a fifth logical product operation circuit for carrying out a logical product operation on the output from the third logical product operation circuit, and the output from the fourth logical product operation circuit, and
   an off-delay circuit and wherein an output of logic value "1" is stopped for a time delay which is at least greater than the time for one period of the scanning output signals when an output of logic value of "1" from the fifth logical product operation circuit is stopped, wherein the output from said off-delay circuit is input to the first logical product operation circuit.

* * * * *